US012787164B2

(12) United States Patent
Lin et al.

(10) Patent No.: US 12,787,164 B2
(45) Date of Patent: Nov. 3, 2026

(54) PRINTED CIRCUIT BOARD STRUCTURE AND PRINTED CIRCUIT BOARD DETECTION METHOD

(71) Applicant: Advanced ACEBIOTEK CO., LTD., Hsinchu County (TW)

(72) Inventors: Yi-Ping Lin, Tainan City (TW); Yung-Chou Hsu, New Taipei City (TW); Jyh-Chern Chen, New Taipei City (TW); Shen-Fu Hsu, Hsinchu County (TW)

(73) Assignee: Advanced ACEBIOTEK CO., LTD., Hsinchu County (TW)

( * ) Notice: Subject to any disclaimer, the term of this patent is extended or adjusted under 35 U.S.C. 154(b) by 760 days.

(21) Appl. No.: 18/143,611

(22) Filed: May 5, 2023

(65) Prior Publication Data

US 2024/0341030 A1 Oct. 10, 2024

(30) Foreign Application Priority Data

Apr. 7, 2023 (TW) ................................ 112113072

(51) Int. Cl.
*H05K 1/03* (2006.01)
*G02F 1/00* (2006.01)
*H05K 1/02* (2006.01)

(52) U.S. Cl.
CPC ........... *H05K 1/036* (2013.01); *G02F 1/0018* (2013.01); *H05K 1/0213* (2013.01); *G02F 2203/13* (2013.01); *H05K 2201/2054* (2013.01)

(58) Field of Classification Search
CPC . G02F 1/0018; G02F 2203/13; H05K 1/0213; H05K 1/036; H05K 2201/2054; H05K 1/0243; H05K 1/0236; H05K 2201/09609; H05K 1/0237; H05K 1/115; H05K 1/144; H05K 3/42; H05K 1/0298; H05K 2201/10121; G01R 1/24; G01R 31/2837; G01R 1/07; G01R 1/071; G01R 29/0878; G01R 31/265; G01R 31/308
See application file for complete search history.

(56) References Cited

U.S. PATENT DOCUMENTS

| | | | | |
|---|---|---|---|---|
| 5,631,572 A * | 5/1997 | Sheen | G01R 31/303 324/763.01 |
| 7,952,365 B2 * | 5/2011 | Narita | G01R 27/2617 324/636 |
| 8,073,641 B2 * | 12/2011 | Kazama | G01R 29/0871 702/65 |
| 8,289,043 B2 * | 10/2012 | Herrman | G01R 31/2896 324/763.01 |

(Continued)

FOREIGN PATENT DOCUMENTS

| | | |
|---|---|---|
| CN | 109479388 A | 3/2019 |
| CN | 113161757 A | 7/2021 |

(Continued)

*Primary Examiner* — Vinh P Nguyen
(74) *Attorney, Agent, or Firm* — Winston Hsu

(57) ABSTRACT

A printed circuit board structure includes a plurality of interface layers; and a detection window, arranged in a plurality of detection regions corresponding to a projected position of a detection entrance in the plurality of interface layers, wherein the detection window is utilized for detecting a plurality of characteristics of the plurality of interface layers.

12 Claims, 10 Drawing Sheets

(56) References Cited

U.S. PATENT DOCUMENTS

| | | | | |
|---|---|---|---|---|
| 9,304,046 | B2 * | 4/2016 | Van Mechelen ... | G01B 11/0683 |
| 11,300,505 | B2 * | 4/2022 | Wallace ................. | G01N 21/89 |
| 2019/0215994 | A1 | 7/2019 | Hiroi | |
| 2019/0269048 | A1 | 8/2019 | Fujita | |
| 2025/0377310 | A1 * | 12/2025 | Hsu ........................ | G01N 21/95 |

FOREIGN PATENT DOCUMENTS

| | | | |
|---|---|---|---|
| CN | 115226289 | * | 10/2022 |
| CN | 115684070 | | 2/2023 |
| TW | M496324 U | | 2/2015 |
| TW | 202307417 | | 2/2023 |

* cited by examiner

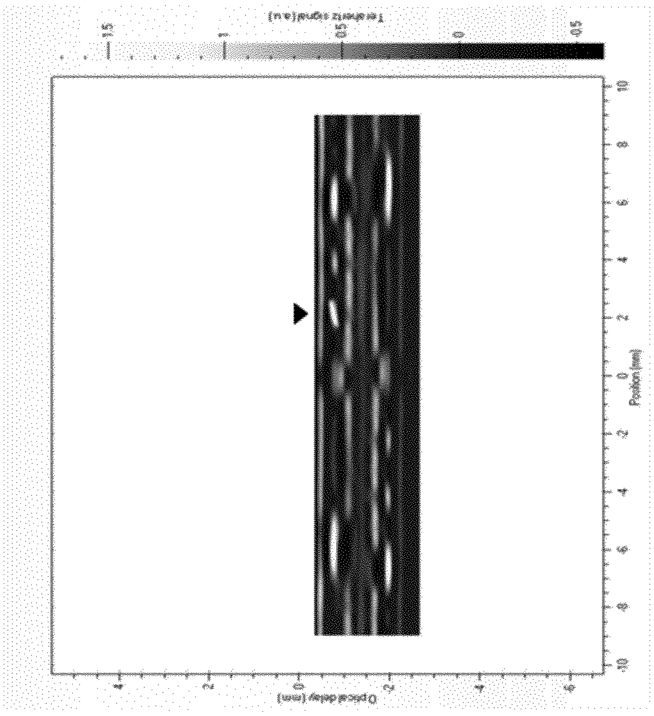
B. Defective PCB
FIG. 6B
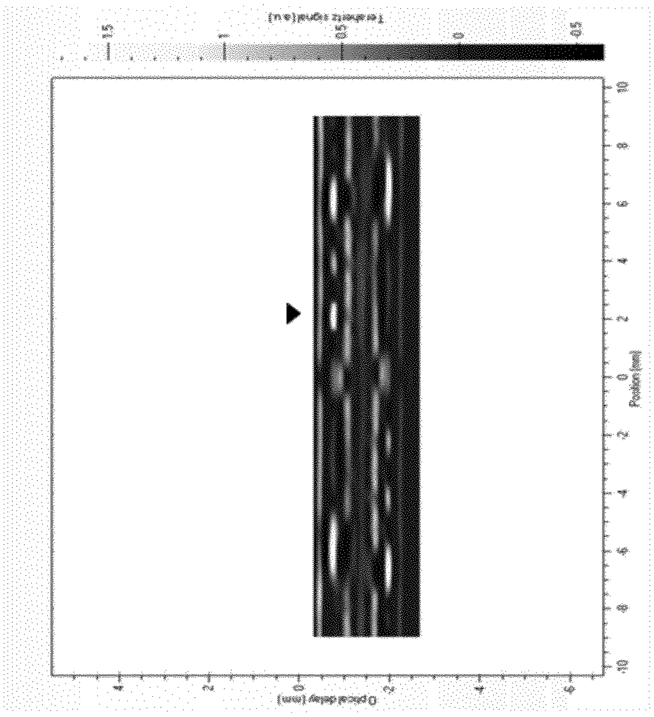
A. Good PCB
FIA. 6A

B. Good PCB

A. Defective PCB

PRINTED CIRCUIT BOARD STRUCTURE AND PRINTED CIRCUIT BOARD DETECTION METHOD

BACKGROUND OF THE INVENTION

1. Field of the Invention

The present invention relates to a printed circuit board structure and a printed circuit board detection method, and more particularly, to a printed circuit board structure and a printed circuit board detection method configured with a detection window.

2. Description of the Prior Art

Printed circuit boards (PCBs) are widely used in electronic devices with increasing functionality and complexity. In general, PCBs can have various forms, such as double-layer, multi-layer, flexible, rigid-flex, copper-based, aluminum-based and BT (Bismaieimide Triazine) resin, and may be single-sided or double-sided. For example, a PCB may be a 12-layer board with copper foil or wire on both sides of each layer. However, PCBs may have defects like voids, gaps and delamination between layers. Moreover, the electrical properties of PCBs in high frequency band may affect the circuit performance in high frequency applications of electronic devices (such as 5G, 6G, and other advance applications). Therefore, to ensure the proper functionality of PCBs, many detection methods for PCBs have been proposed.

Some of the current detection methods for PCBs are structural, such as X-ray and microsection analysis, while others are electrical, such as flying-probe testing. However, none of these methods can detect both structural and electrical defects of PCBs at the same time, and some of them are destructive.

Therefore, it is necessary to improve the prior art.

SUMMARY OF THE INVENTION

Therefore, the purpose of the present invention is to provide a printed circuit board structure and a printed circuit board detection method to improve the drawbacks of the prior art.

The embodiment of the present invention discloses a printed circuit board structure, comprising a plurality of interface layers; and a detection window, disposed at a plurality of detection regions corresponding to a projection position of a detection entrance in the plurality of interface layers, wherein the detection window is utilized to detect a plurality of characteristics of the plurality of interface layers.

The embodiment of the present invention discloses a printed circuit board detection method, comprising disposing a detection window at a plurality of detection regions corresponding to a projection position of a detection entrance in a plurality of interface layers of a printed circuit board; and utilizing a first terahertz electromagnetic wave to pass through the detection window of the printed circuit board, to detect a plurality of characteristics of the plurality of interface layers of the printed circuit board.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6A and FIG. 6B are schematic diagrams of line scans (b-scan) of the electric field strength distribution of good and defective printed circuit boards.

DETAILED DESCRIPTION

Certain terms are used throughout the description and following claims to refer to particular components. As one skilled in the art will appreciate, hardware manufacturers may refer to a component by different names. This document does not intend to distinguish between components that differ in name but not function. In the following description and in the claims, the terms “include” and “comprise” are utilized in an open-ended fashion, and thus should be interpreted to mean “include, but not limited to”. “Approximately” means that within the acceptable error range, a person with ordinary knowledge in the field can solve the technical problem within a certain error range and basically achieve the technical effect. Also, the term “couple” is intended to mean either an indirect or direct, wired or wireless electrical connection.

Figure 1:
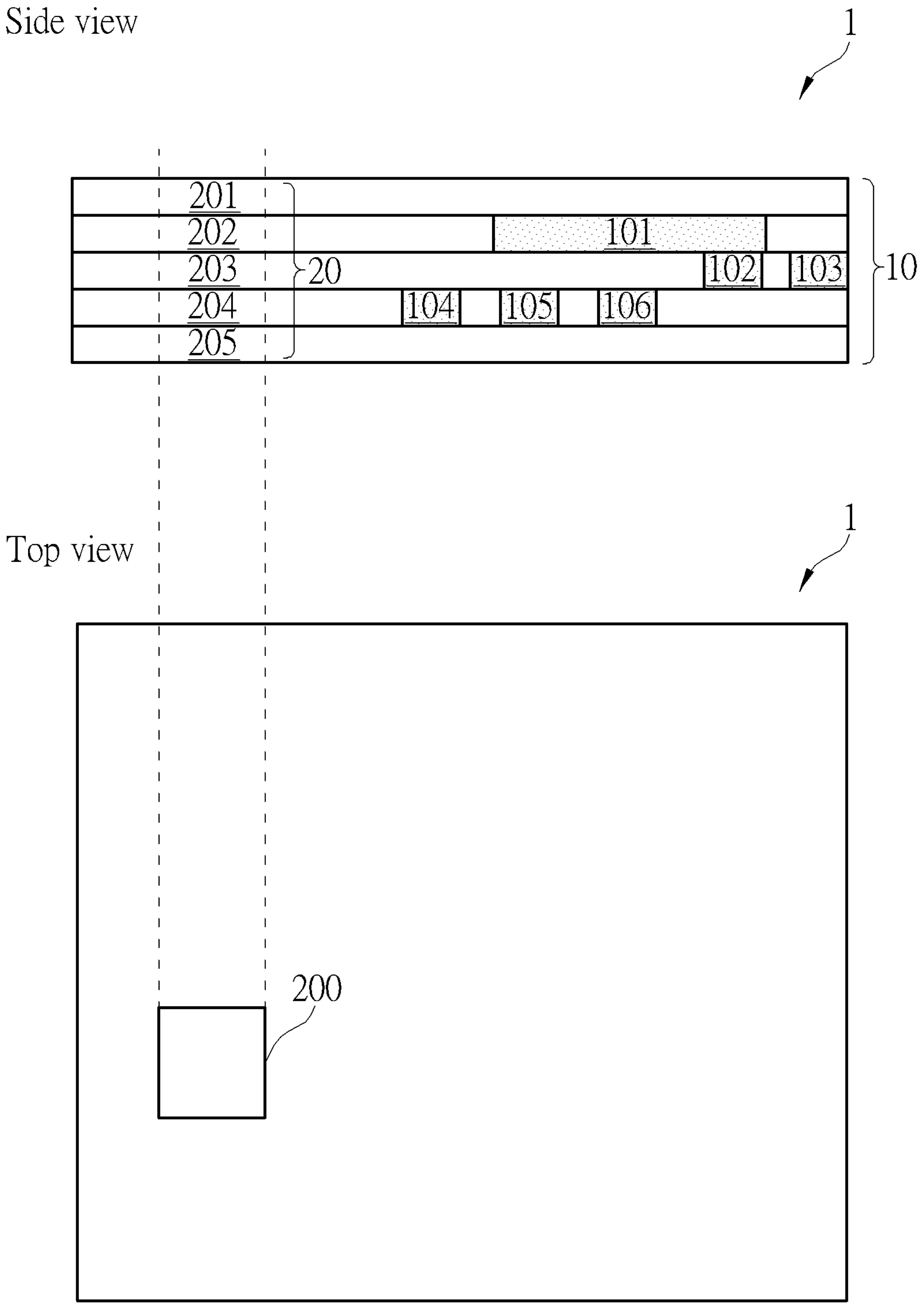
FIG. 1 is a schematic diagram of a top view and a side view of a printed circuit board structure according to an embodiment of the present invention.

FIG. 1 is a schematic diagram of a top view and a side view of a printed circuit board structure 1 according to an embodiment of the present invention. As shown in the side view schematic diagram of FIG. 1, the printed circuit board structure 1 includes a plurality of interface layers 10. The plurality of interface layers 10 may embed a copper foil 101 or copper conductors 102-106 depending on the circuit design requirements. In order to detect the structure and electrical properties of the printed circuit board structure 1, a detection window 20 is provided in the printed circuit board structure 1. Specifically, as shown in the top view of FIG. 1, a projection position of a detection entrance 200 on a surface layer of the printed circuit board structure 1 is set as the detection window 20, and the detection window 20 includes a plurality of detection regions 201-205 corresponding to the projection position of the detection entrance 200. In this way, the embodiment of the present invention may further use terahertz electromagnetic waves to pass through the detection window 20 to detect the structure and the electrical properties of the plurality of interface layers 10 of the printed circuit board structure 1. It should be noted that the terahertz electromagnetic waves are pulsed electromagnetic waves having a frequency of $10^{11}$ Hz-$10^{13}$ Hz. The photons carried by the terahertz electromagnetic waves have low energy and will not damage the molecular structure, maintaining the integrity of the printed circuit board structure.

Figure 2A:
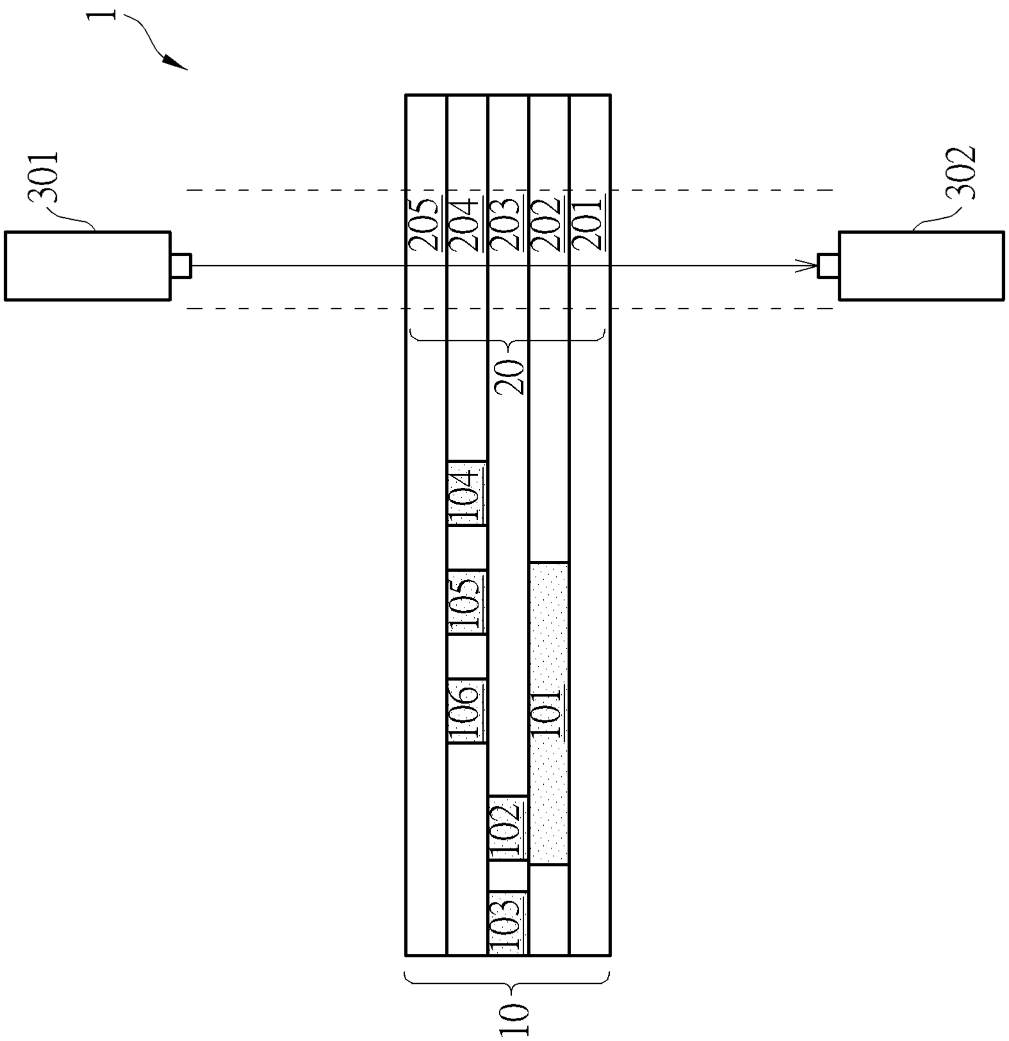
FIG. 2A and FIG. 2B are schematic diagrams of utilizing the terahertz electromagnetic waves to detect the printed circuit board structure according to an embodiment of the present invention.
Figure 2B:
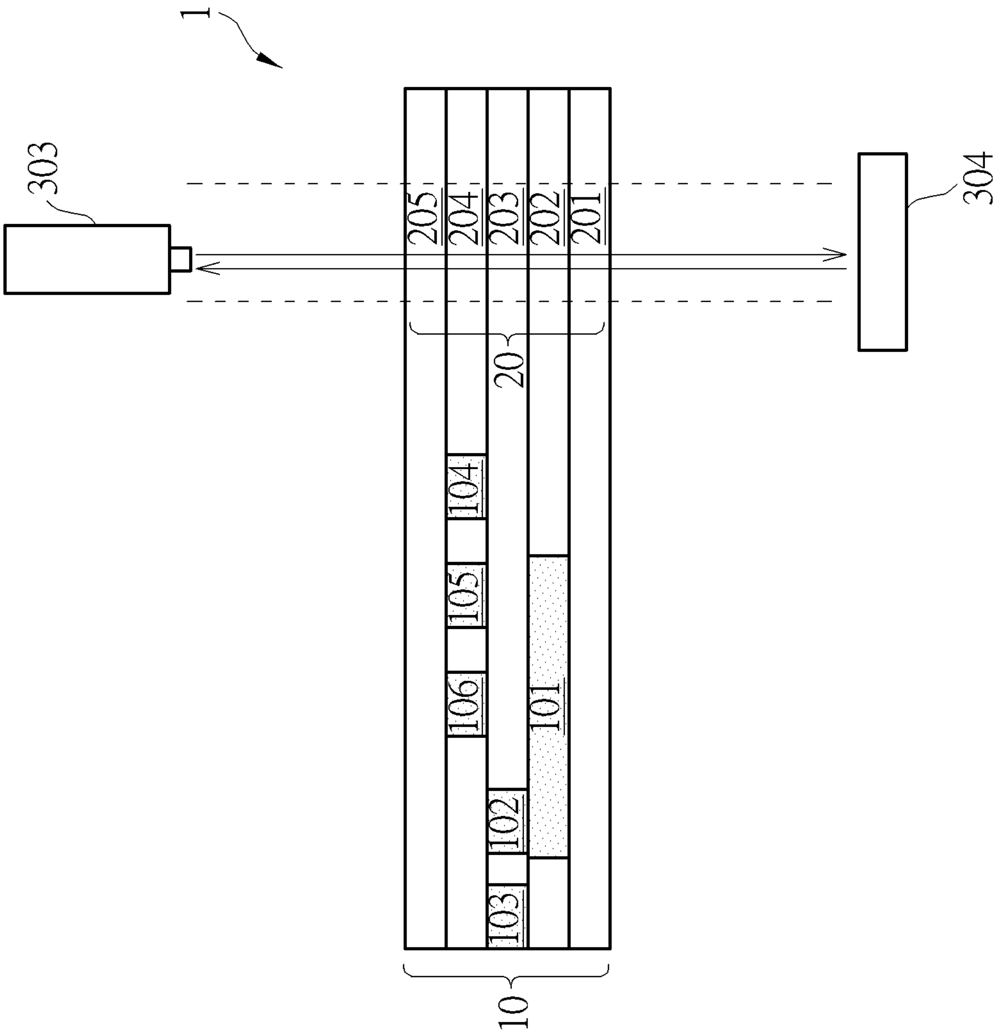

Please refer to FIG. 2A and FIG. 2B. FIG. 2A and FIG. 2B are schematic diagrams of utilizing the terahertz electromagnetic waves to detect the printed circuit board structure 1 according to an embodiment of the present invention. As shown in FIG. 2A, a terahertz electromagnetic wave transmitter 301 generates the terahertz electromagnetic waves and emits the terahertz electromagnetic waves into the detection window 20. After the terahertz electromagnetic waves pass through the plurality of detection regions 201-205, the terahertz electromagnetic waves are received by a terahertz electromagnetic wave receiver 302, so that the structure and electrical properties of the plurality of interface layers 10 may be detected according to the received terahertz electromagnetic waves. It should be noted that, the plurality of detection regions 201-205 of the detection window 20 do not have any copper foil or copper conductors passed through. In other words, the plurality of detection regions 201-205 are composed of non-metallic materials such as a bakelite, a glass, an epoxy resin or a plastic. Therefore, the terahertz electromagnetic waves may not be reflected at any detection region of the plurality of detection regions 201-205. It should be noted that, the plurality of detection regions 201-205 may also be composed of materials with a terahertz electromagnetic wave transmission rate greater than 20%. Those skilled in the art may adjust the material of any of the detection regions as required for the detection. In another embodiment, as shown in FIG. 2B, a terahertz electromagnetic wave 303 generates sensor the terahertz electromagnetic waves, and emits the terahertz electromagnetic waves into the detection window 20. After the terahertz electromagnetic waves pass through the plurality of detection regions 201-205, the terahertz electromagnetic waves are reflected by a reflector 304. The terahertz electromagnetic wave sensor 303 receives the terahertz electromagnetic waves reflected by the reflector 304, so that the structure and electrical properties of the plurality of interface layers 10 may be detected according to the received terahertz electromagnetic waves.

Figure 3A:
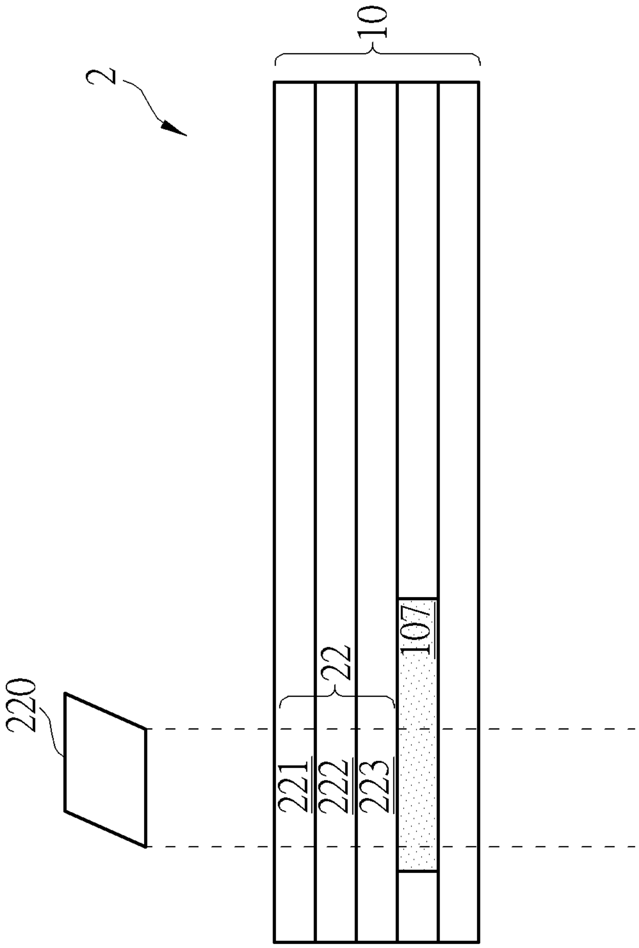
FIG. 3A is a schematic diagram of a printed circuit board structure according to an embodiment of the present invention.
Figure 3B:
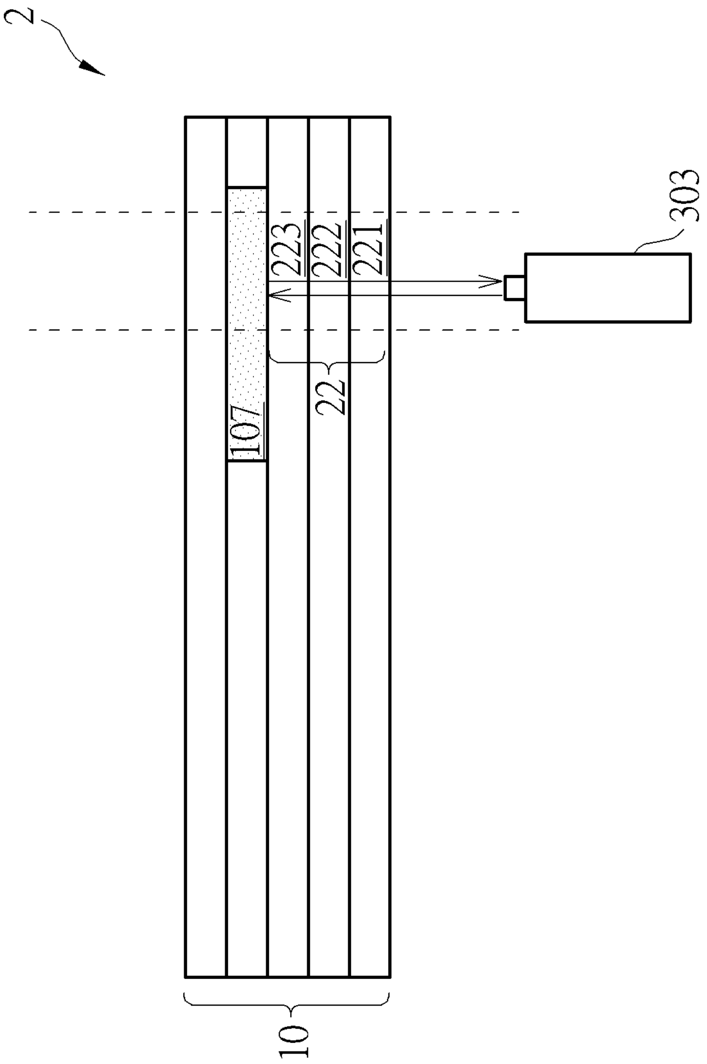
FIG. 3B is a schematic diagram of utilizing the terahertz electromagnetic waves to detect the printed circuit board structure according to an embodiment of the present invention.

Moreover, as the number of layers in the printed circuit board may be numerous, in order to accommodate different requirements for target layer detection, only some of the interface layers of the plurality of interface layers may be detected. Please refer to FIG. 3A. FIG. 3A is a schematic diagram of a printed circuit board structure 2 according to an embodiment of the present invention. The printed circuit board structure 2 is derived from the printed circuit board structure 1, with the difference that the projection position of one interface layer in the plurality of interface layers 10 of the printed circuit board structure 2 corresponding to a detection entrance 220 is a reflective region, and a copper foil 107 is provided in the reflective region, so that the terahertz electromagnetic waves may be reflected when emitted into the copper foil 107. In detail, FIG. 3B is a schematic diagram of utilizing the terahertz electromagnetic waves to detect the printed circuit board structure 2 according to an embodiment of the present invention. As shown in FIG. 3B, the terahertz electromagnetic wave sensor 303 generates the terahertz electromagnetic waves and emits the terahertz electromagnetic waves into a detection window 22 of the printed circuit board structure 2. The terahertz electromagnetic waves pass through the plurality of detection regions 221-223 of the printed circuit board structure 2, and are then reflected by the copper foil 107. The terahertz electromagnetic wave sensor 303 receives the reflected terahertz electromagnetic waves, so that the structure and electrical properties of some interface layers may be detected according to the received terahertz electromagnetic waves. It should be noted that, FIG. 3A and FIG. 3B are only embodiments of the present invention, and those skilled in the art may adjust the position of the reflective region or the material of the reflective region according to the detection requirements. For example, the reflective region may be composed of the copper conductors, metal, heavily doped materials, high reflectivity materials or materials with a terahertz electromagnetic wave reflectivity greater than 20%, and is not limited thereto.

Figure 4:
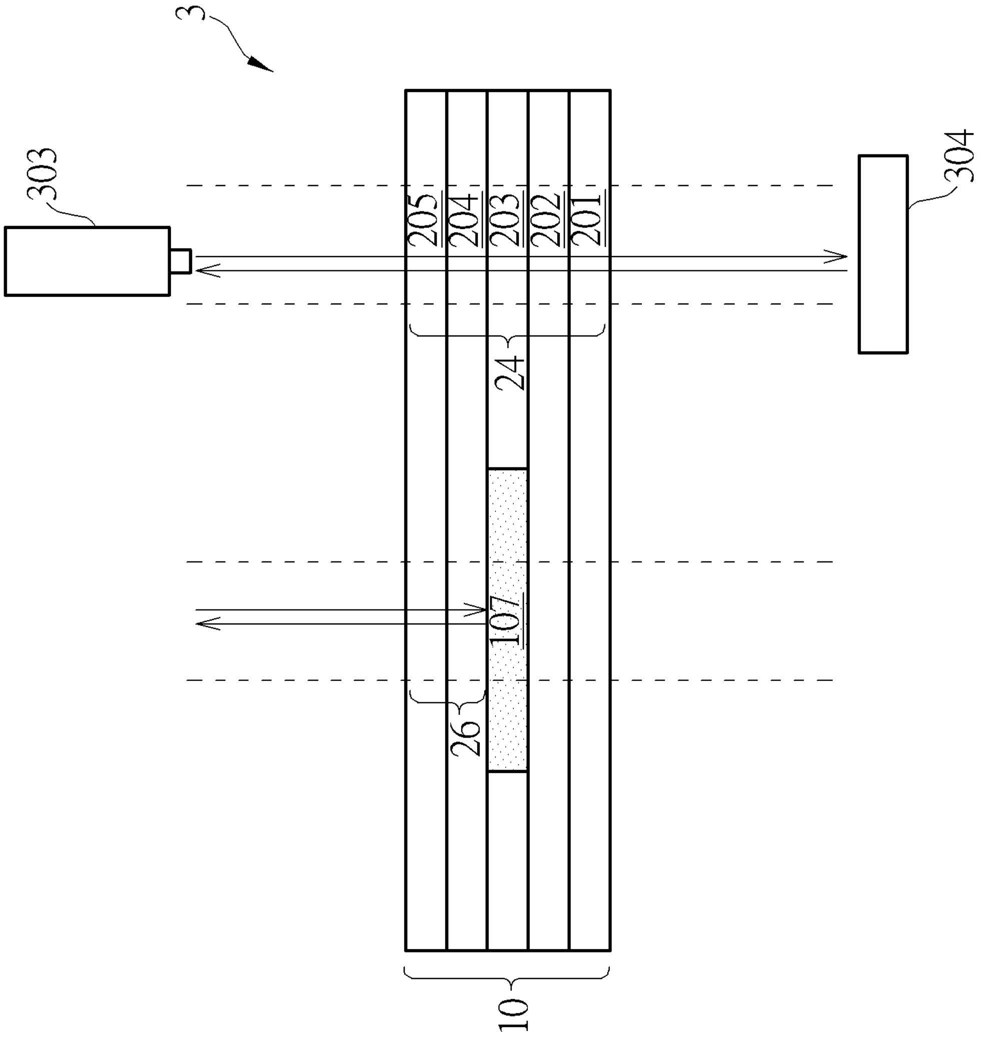
FIG. 4 is a schematic diagram of a printed circuit board structure according to an embodiment of the present invention.

Furthermore, the detection window may be distinguished as a deep detection window or a shallow detection window. The deep detection window corresponds to the detection window that allows the terahertz electromagnetic waves to pass through every layer of the detection regions (e.g., the detection window 20 of the printed circuit board structure 1). The shallow detection window corresponds to the detection window that only allows the terahertz electromagnetic waves to pass through certain layers of the detection region (e.g., the detection window 22 of the printed circuit board structure 2). Those skilled in the art may appropriately set multiple detection windows on the printed circuit board. For example, please refer to FIG. 4. FIG. 4 is a schematic diagram of a printed circuit board structure 3 according to an embodiment of the present invention. The printed circuit board structure 3 sets a deep detection window 24 and a shallow detection window 26. The terahertz electromagnetic wave sensor 303 generates the terahertz electromagnetic waves and emits the terahertz electromagnetic waves into the deep detection window 24 and the shallow detection window 26. After passing through the deep detection window 24, the terahertz electromagnetic waves are reflected by the reflector 304. On the other hand, after passing through the shallow detection 26, window the terahertz electromagnetic waves are reflected by the copper foil 107. The terahertz electromagnetic wave sensor 303 receives the reflected terahertz electromagnetic waves, so that the structure and electrical properties of the printed circuit board 3 may be detected according to the received terahertz electromagnetic waves.

Figure 5A:
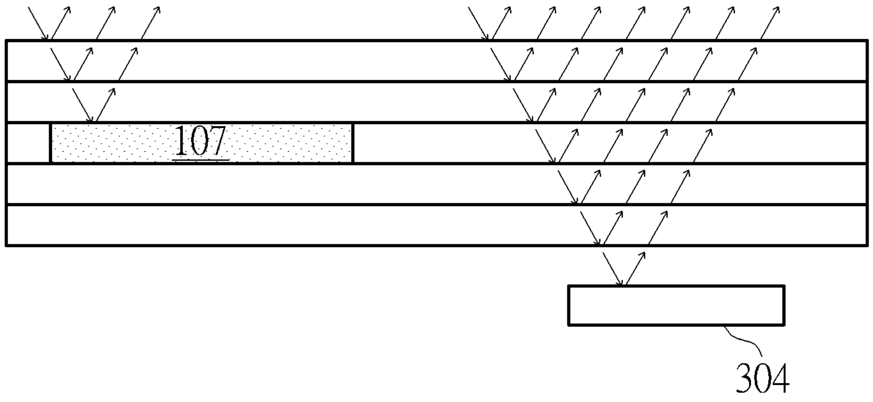
FIG. 5A is a schematic diagram of the terahertz electromagnetic waves emit into the printed circuit board structure of FIG. 4 according to an embodiment of the present invention.
Figure 5B:
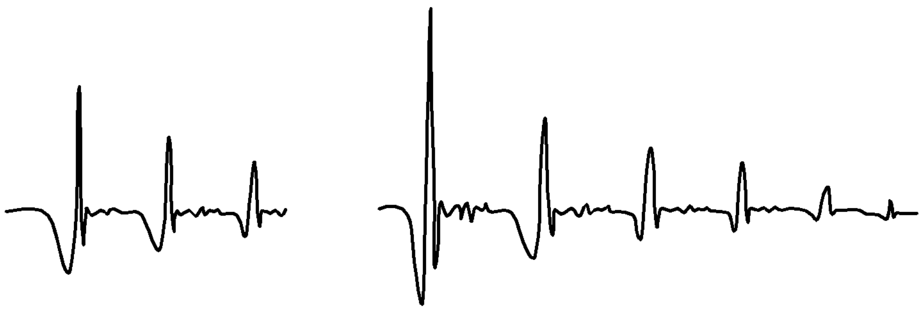
FIG. 5B is a schematic diagram of the terahertz electromagnetic waves received by the terahertz electromagnetic wave sensor according to the embodiment of the present invention.

More precisely, when the refractive indexes of the plurality of interface layers of the printed circuit board are different, the propagation speeds of the terahertz electromagnetic waves in the interface layers also differ, resulting in partial reflection of the terahertz electromagnetic waves. Therefore, the terahertz electromagnetic wave sensor may receive multiple reflected terahertz electromagnetic waves corresponding to different time of flight. For example, please refer to FIG. 5A and FIG. 5B. FIG. 5A is a schematic diagram of the terahertz electromagnetic waves emitted into the printed circuit board structure 3 of FIG. 4 according to an embodiment of the present invention. FIG. 5B is a schematic diagram of the terahertz electromagnetic waves received by the terahertz electromagnetic wave sensor 303 according to the embodiment of the present invention. As shown in FIG. 5A, when the terahertz electromagnetic waves are emitted into the shallow detection window 26, both the first and the second layers of the detection region may partially reflect the terahertz electromagnetic waves, while the copper foil 107 may fully reflect the terahertz electromagnetic waves. Therefore, as shown in FIG. 5B, the terahertz electromagnetic wave sensor 303 receives the terahertz electromagnetic waves corresponding to three different times of flight. Similarly, when the terahertz electromagnetic waves are emitted into the deep detection window 24, each layer of the detection region may partially reflect the terahertz electromagnetic waves, while the reflector 304 may fully reflect the terahertz electromagnetic waves. Please refer to the above-mentioned description for details, which will not be repeated here.

Figure 7B:
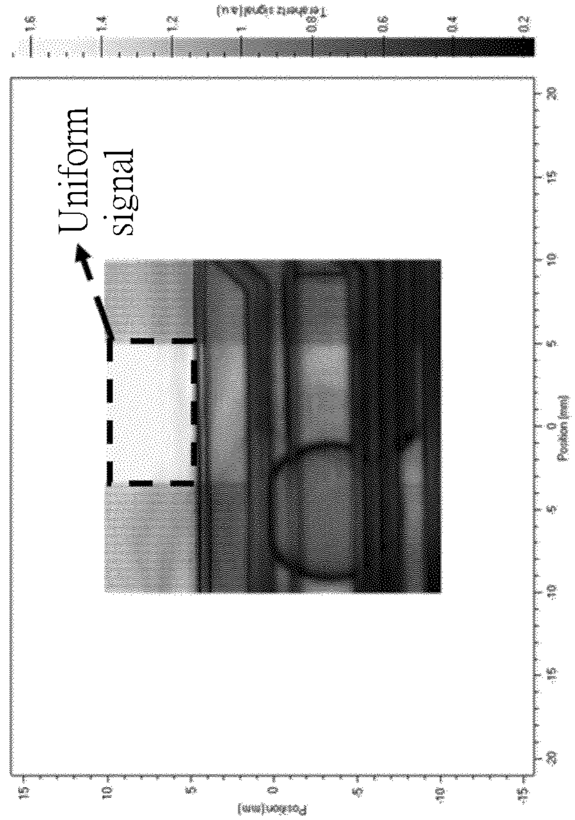
FIG. 7A and FIG. 7B are schematic diagrams of surface scans (c-scan) of the electric field strength distribution of good and defective printed circuit boards.
Figure 7A:
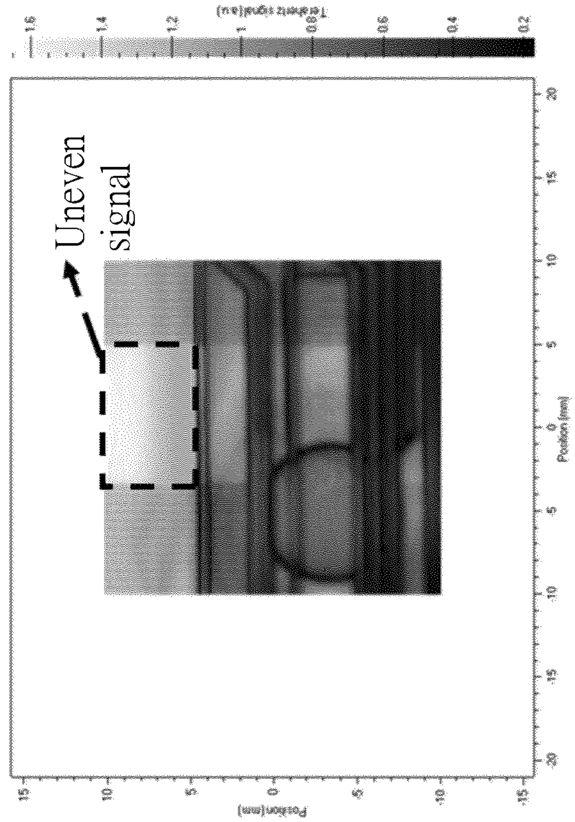

It should be noted that, the received terahertz electromagnetic waves may be used to analyze characteristic signals such as an electric field strength and an electric field phase to determine a thickness, a stress variation, a structural state, an electric coefficient and an optical coefficient of each surface layer of the plurality of interface layers. In addition, the structural state may include defect states such as voids, gaps, and delamination. The electrical coefficient may be a dielectric coefficient or a resistance. The optical coefficient may be an absorption coefficient, a refractive, a reflection coefficient, a loss coefficient or a transmittance, and is not limited thereto. For example, FIG. 6A and FIG. 6B are schematic diagrams of line scans (b-scan) of the electric field strength distribution of good and defective printed circuit boards. Comparing the electric field strength distributions in FIG. 6A and FIG. 6B, it can be seen that the region indicated by the arrow in FIG. 6B exhibits an uneven distribution of the interface layers. In another example, FIG. 7A and FIG. 7B are schematic diagrams of surface scans (c-scan) of the electric field strength distribution of good and defective printed circuit boards. Comparing the electric field strength distributions in FIG. 7A and FIG. 7B, it can be seen that the middle upper region in FIG. 7B exhibits an uneven distribution of the interface layers.

Figure 8B:
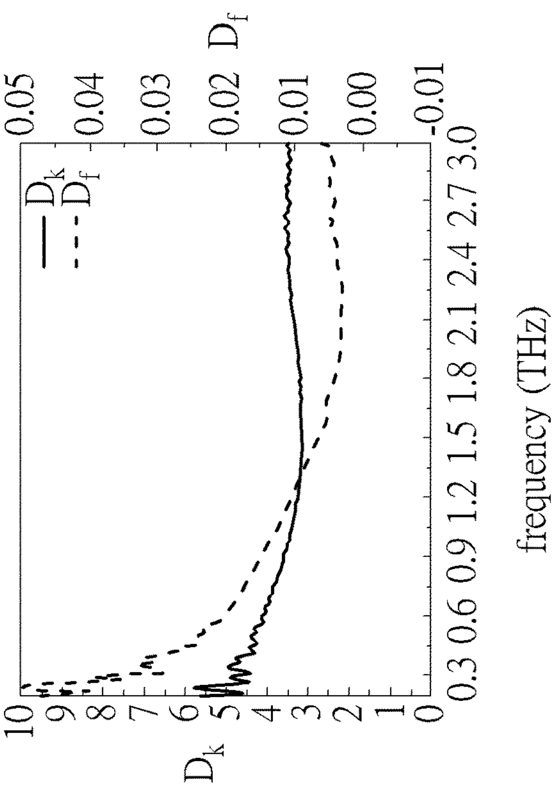
FIG. 8B is a frequency domain diagram of the electrical coefficients at the specific location according to an embodiment of the present invention.
Figure 8A:
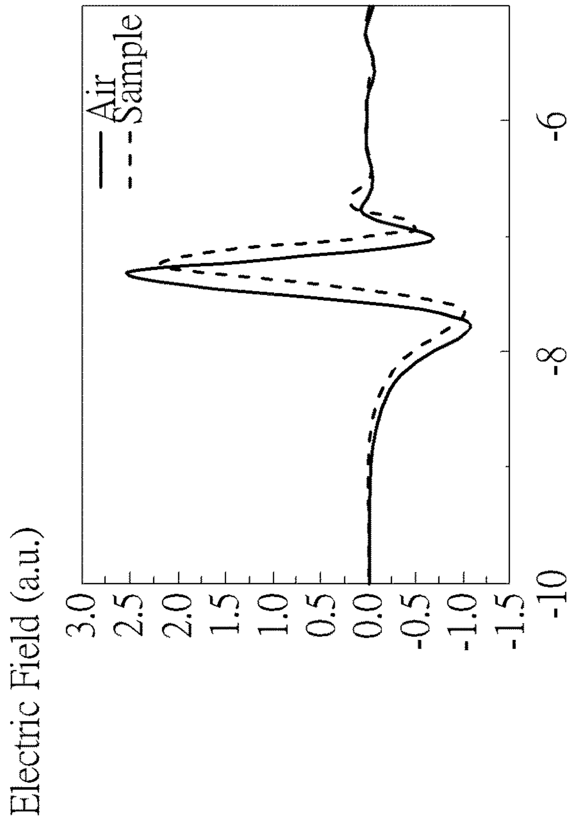
FIG. 8A is a time-domain diagram of the electrical field strength of a specific location in the detection region according to an embodiment of the present invention.

On the other hand, in high-frequency applications of electronic devices, such as 5G, 6G and other advanced applications, the electrical characteristics of the printed circuit board may affect the operation of the electronic circuits. Therefore, by setting the detection window in the printed circuit board, it is more convenient to detect the electrical coefficients of the printed circuit board at high frequency, such as $\varepsilon$, $\varepsilon'$, $\varepsilon''$, $\rho$, $D_k$ and $D_f$. FIG. 8A is a time-domain diagram of the electrical field strength of a specific location in the detection region according to an embodiment of the present invention. By analyzing the electric field strength of the specific location, the electrical coefficient of the specific region at high frequency may be detected. FIG. 8B is a frequency domain diagram of the electrical coefficients at the specific location according to an embodiment of the present invention. In this way, by obtaining the frequency domain diagram of the electrical coefficients $D_k$ and $D_f$, the real and imaginary parts of the electrical coefficients at different frequency bands may be obtained, and the matching of the electrical coefficients may be carried out accordingly.

In addition, the above-mentioned embodiments are used to illustrate the concept of the present invention, and those skilled in the art may make various modifications accordingly, but are not limited thereto. Therefore, as long as the printed circuit board detection method and the printed circuit board structure are designed with the detection window set in the printed circuit board structure to obtain the transmitted and reflected terahertz electromagnetic waves, and the structural and electrical characteristics of the printed circuit board are analyzed through time domain and frequency domain analysis methods, then the requirements of the present invention are satisfied, which belong to the scope of the present invention.

In summary, the present invention provides a printed circuit board detection method for the printed circuit board structure set with a detection window, for utilizing the terahertz electromagnetic waves to pass through the detection window of the printed circuit board, and receiving the reflected terahertz electromagnetic waves to detect the plurality of characteristics of the plurality of interface layers of the printed circuit board.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A printed circuit board structure, comprising:
- a plurality of interface layers; and
- a detection window, disposed at a plurality of detection regions corresponding to a projection position of a detection entrance in the plurality of interface layers, wherein the detection window is configured to be transparent to a first terahertz electromagnetic wave passing through, to detect a plurality of characteristics of the plurality of interface layers.

2. The printed circuit board structure of claim 1, wherein a material of the plurality of detection regions is a bakelite, a glass, an epoxy resin or a plastic.

3. The printed circuit board structure of claim 2, wherein the material of at least one detection region of the plurality of detection regions is a metal, a heavily doped material or a highly reflective material.

4. The printed circuit board structure of claim 1, wherein an area of the detection window is greater than or equal to 0.05 millimeters by 0.05 millimeters.

5. A printed circuit board detection method, comprising:
- disposing a detection window at a plurality of detection regions corresponding to a projection position of a detection entrance in a plurality of interface layers of a printed circuit board; and
- utilizing a first terahertz electromagnetic wave to pass through the detection window of the printed circuit board, to detect a plurality of characteristics of the plurality of interface layers of the printed circuit board.

6. The printed circuit board detection method of claim 5, wherein a material of the plurality of detection regions a bakelite, a glass, an epoxy resin or a plastic.

7. The printed circuit board detection method of claim 6, wherein utilizing the first terahertz electromagnetic wave to detect the plurality of characteristics of the plurality of interface layers comprises:
- emitting the first terahertz electromagnetic wave into the detection window;
- detecting a second terahertz electromagnetic wave originated from the first terahertz electromagnetic wave being emitted into the detection window and passing through the plurality of interface layers; and detecting the plurality of characteristics of the plurality of interface layers according to the second terahertz electromagnetic wave.

8. The printed circuit board detection method of claim 6, wherein the plurality of detection regions comprise a reflective region, and the material of the reflective region is a metal, a heavily doped material or a highly reflective material.

9. The printed circuit board detection method of claim 8, wherein utilizing the first terahertz electromagnetic wave to detect the plurality of characteristics of the plurality of interface layers comprises:

emitting the first terahertz electromagnetic wave into the detection window;

detecting the second terahertz electromagnetic wave originated from the first terahertz electromagnetic wave being emitted into the detection window and reflected by the reflective region; and detecting the plurality of characteristics of the plurality of interface layers according to the second terahertz electromagnetic wave.

10. The printed circuit board detection method of claim 5, wherein an area of the detection window is greater than or equal to 0.05 millimeters by 0.05 millimeters.

11. The printed circuit board detection method of claim 5, wherein a frequency of the first terahertz electromagnetic wave is $10^{11}$ Hz-$10^{13}$ Hz.

12. The printed circuit board detection method of claim 5, wherein the plurality of characteristics are an absorption coefficient, a refractive index, a reflectivity, a loss coefficient, a thickness, a transmittance, a dielectric constant, a resistance or a stress change of the plurality of interface layers.

* * * * *